(12) United States Patent
Kaltenbach et al.

(10) Patent No.: US 6,916,221 B2
(45) Date of Patent: Jul. 12, 2005

(54) DETERMINING DEFECTS IN OLED DEVICES

(75) Inventors: Thomas F. Kaltenbach, Webster, NY (US); Paul J. Guiguizian, Pittsford, NY (US); Donald A. Stephenson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 266 days.

(21) Appl. No.: 10/298,747

(22) Filed: Nov. 18, 2002

(65) Prior Publication Data

US 2004/0097160 A1 May 20, 2004

(51) Int. Cl.[7] .................................................. H01J 9/42
(52) U.S. Cl. ........................................ 445/3; 315/169.1
(58) Field of Search .............................. 445/3, 24, 25; 315/169.1, 169.3

(56) References Cited

U.S. PATENT DOCUMENTS

| | | |
|---|---|---|
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 5,742,129 A | 4/1998 | Nagayama et al. |
| 2001/0048110 A1 | 12/2001 | Hiroki |
| 2002/0047565 A1 | 4/2002 | Nara et al. |
| 2002/0142697 A1 | 10/2002 | Yamagata et al. |

FOREIGN PATENT DOCUMENTS

| | | |
|---|---|---|
| JP | 96236027 A | 9/1996 |
| JP | 99329229 A | 11/1999 |
| JP | 2001-116653 | 4/2001 |
| JP | 2003-257652 | 9/2003 |

OTHER PUBLICATIONS

Ishii et al, Energy–level alignment at model interface of organic electroluminescent devices studied by UV photoemission: trend in the deviation from the traditional way of estimating the interfacial electronic structures, IEEE Journal of Selected Topics in Quantum Eelectronics, Jan–Feb, 1998, IEEE, USA, vol. 4, No. 1, pp. 24–33.

*Primary Examiner*—Joseph Williams
(74) *Attorney, Agent, or Firm*—Raymond L. Owens (57) ABSTRACT

A method of determining defects in OLED devices having a plurality of pixels, each with its own emissive layer, which are capable of being excited by input light to produce an output color light response, including illuminating one or more OLED devices or a portion of an OLED device with light in a predetermined portion of the spectrum so that the pixel emissive layers are excited to produce an output color response for each pixel, capturing an image of the output light produced by the excited pixels and converting such captured light into a digital image; and determining device pixel size, shape, location, and emitted light intensity from the digital image and comparing such size, shape, location, and emitted light intensity with predetermined acceptable size, shape, location, and emitted light intensity ranges to determine whether there is a defect in the OLED device(s).

14 Claims, 7 Drawing Sheets

DETERMINING DEFECTS IN OLED DEVICES

FIELD OF THE INVENTION

The present invention relates to organic light emitting devices (OLED) and more particularly to determining defects in such devices.

BACKGROUND OF THE INVENTION

An organic light-emitting device, also referred to as an organic electroluminescent device, can be constructed by sandwiching two or more organic layers between first and second electrodes.

In a passive matrix organic light-emitting device of conventional construction, a plurality of laterally spaced light-transmissive anodes, for example indium-tin-oxide (ITO) anodes are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ Torr. A plurality of laterally spaced cathodes are deposited as second electrodes over an uppermost one of the organic layers. The cathodes are oriented at an angle, typically at a right angle, with respect to the anodes.

Such conventional passive matrix organic light-emitting devices are operated by applying an electrical potential (also referred to as a drive voltage) between an individual row (cathode) and, sequentially, each column (anode). When a cathode is biased negatively with respect to an anode, light is emitted from a pixel defined by an overlap area of the cathode and the anode, and emitted light reaches an observer through the anode and the substrate.

In an active matrix organic light-emitting device, an array of anodes is provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in commonly-assigned U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in U.S. Pat. Nos. 4,356,429; 4,539,507; 4,720,432; and 4,769,292, the disclosures of which are herein incorporated by reference.

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic organic EL device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the light-emitting layer of the organic EL medium. Other organic layers present in the organic EL medium can provide electronic transport functions primarily, such as the hole-transporting layer or the electron-transporting layer. In forming the RGB pixels in a full-color organic EL display panel, it is necessary to devise a method to precisely pattern the light-emitting layer of the organic EL medium or the entire organic EL medium.

Typically, electroluminescent pixels are formed on the display by shadow masking techniques, such as shown in U.S. Pat. No. 5,742,129. The shadow mask is designed allow a plurality of pixels to be deposited during one deposition step. By performing multiple deposition steps with different materials with different emission characteristics, full-color pixels consisting of red, green, and blue sub-pixels can be produced. Although the shadow masking technique has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow-mask method is that the mask holes can become plugged with time. Plugged holes on the mask lead to the undesirable result of non-functioning pixels on the EL display. Consequently, it is desirable to have some way of inspecting the OLED device for problems originating with the shadow mask.

SUMMARY OF THE INVENTION

It is therefore an object of the present invention to provide a detection arrangement that is particularly effective for determining defects in size, shape, location, and light intensity of pixels in one or more OLED devices.

This object is achieved by a method of determining defects in OLED devices having a plurality of pixels, each with its own emissive layer, which are capable of being excited by input light to produce an output color light response, comprising the steps of:

a) illuminating one or more OLED devices with light in a predetermined portion of the spectrum so that the pixel emissive layers are excited to produce an output color response for each pixel;

b) capturing an image of the output light produced by the excited pixels and converting such captured light into a digital image; and c) determining size, shape, location, and light intensity in response to the captured digital pixel and comparing such size, shape, location, and light intensity with predetermined acceptable size, shape, location, and light intensity ranges to determine whether there is a defect in the OLED device(s).

The present invention provides the following advantages. It makes use of the property that the emissive layers of OLED devices can be excited by a illumination source using a predetermined portion of the spectrum and an image can be captured from the excited pixels of the OLED device. By operating on the converted digital image an effective defect detection arrangement can be achieved. The present invention can be configured to operate in a variety of environments, including operation within a vacuum or controlled atmosphere chamber.

DETAILED DESCRIPTION OF THE INVENTION

The inspection system described herein utilizes the phenomenon called photoluminescence. Photoluminescence is the process whereby a material absorbs light energy within a certain wavelength range, and re-emits that light energy at longer wavelengths. Phosphorescence and fluorescence are two separate emission pathways collectively termed photoluminescence. The absorbed light is called excitation light, and the resulting luminescent light is called emission light. The wavelengths of absorption and emission are dependent upon the specific composition of the material; in the case of the organic materials deposited in an OLED display, the emission wavelengths from photoluminescence are very similar to the wavelengths generated by electroluminescence, the underlying process for normal display usage. Because the excitation wavelengths depend upon the absorption characteristics of the material to be inspected, a predetermined portion of the spectrum can be chosen for best excitation. This makes inspection via photoluminescence particularly useful in assessing the quality of the light-emitting layers prior to assembling a completed display device. The emitted light from the excited pixels can be captured by a camera into a digital image and subsequently analyzed and evaluated for various quality criteria such as device pixel size, shape, location, and emitted light intensity. In addition, by using a color camera for the image capture, an analysis of the color of the emitted light can be performed and compared to acceptable color criteria. Different colored light produced by different device pixels can be captured by the camera. By specifying predetermined acceptable limits for these quality criteria, a device can be categorized as to whether or not it is defective. This categorization can be performed automatically by a computer program or an output image can be generated from the criteria and a user can inspect the output image to determine the categorization.

Figure 1:
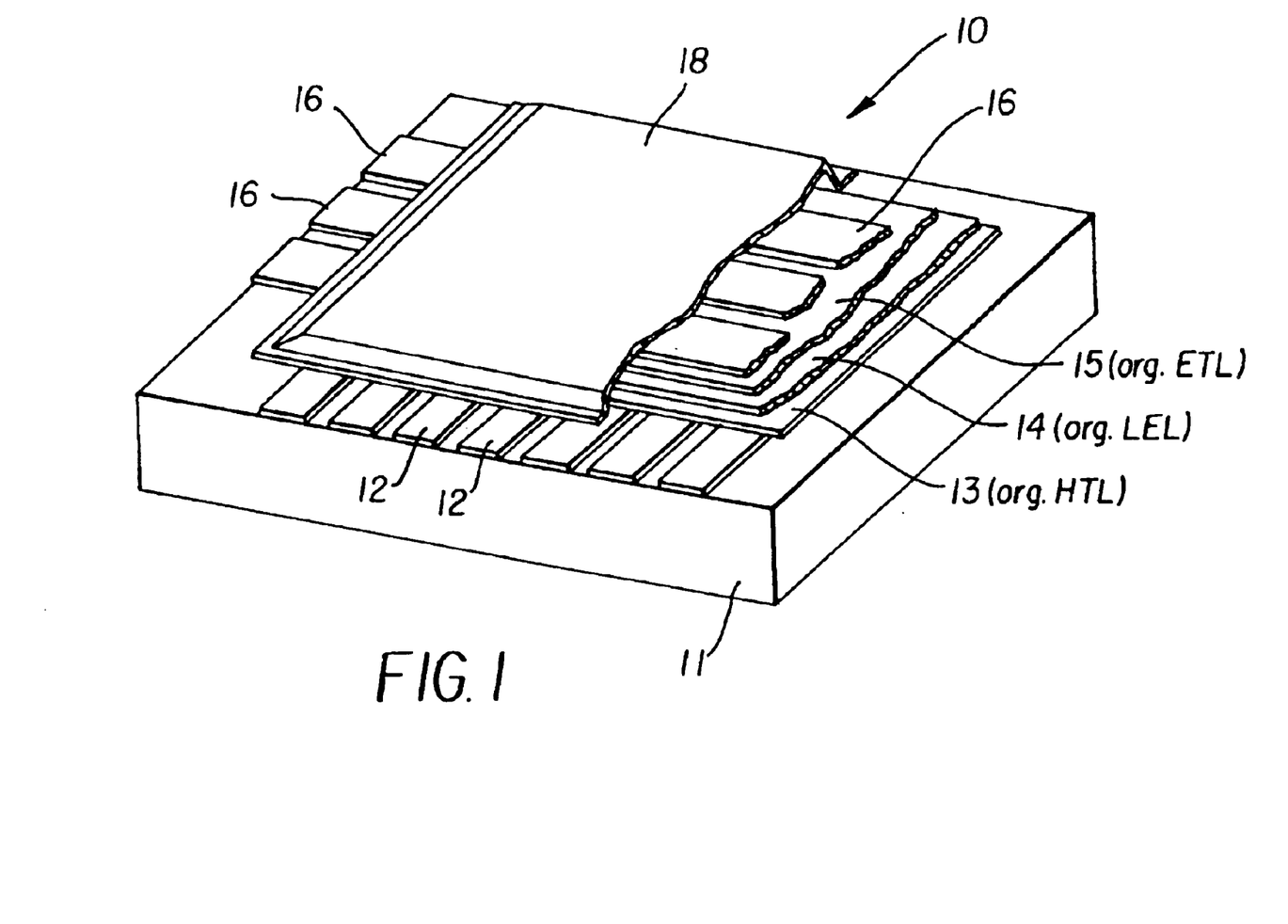
FIG. 1 is a schematic perspective of a passive matrix organic light-emitting device (OLED) having partially peeled-back elements to reveal various layers.

Turning to FIG. 1, a schematic perspective of a passive matrix organic light-emitting device (OLED) 10 is shown having partially peeled-back elements to reveal various layers.

A light-transmissive substrate 11 has formed thereon a plurality of laterally spaced first electrodes 12 (also referred to as anodes). An organic hole-transporting layer (HTL) 13, an organic light-emitting layer (LEL) 14, and an organic electron-transporting layer (ETL) 15 are formed in sequence by a physical vapor deposition, as will be described in more detail hereinafter. A plurality of laterally spaced second electrodes 16 (also referred to as cathodes) are formed over the organic electron-transporting layer 15, and in a direction substantially perpendicular to the first electrodes 12. An encapsulation or cover 18 seals environmentally sensitive portions of the structure, thereby providing a completed OLED 10.

Figure 2:
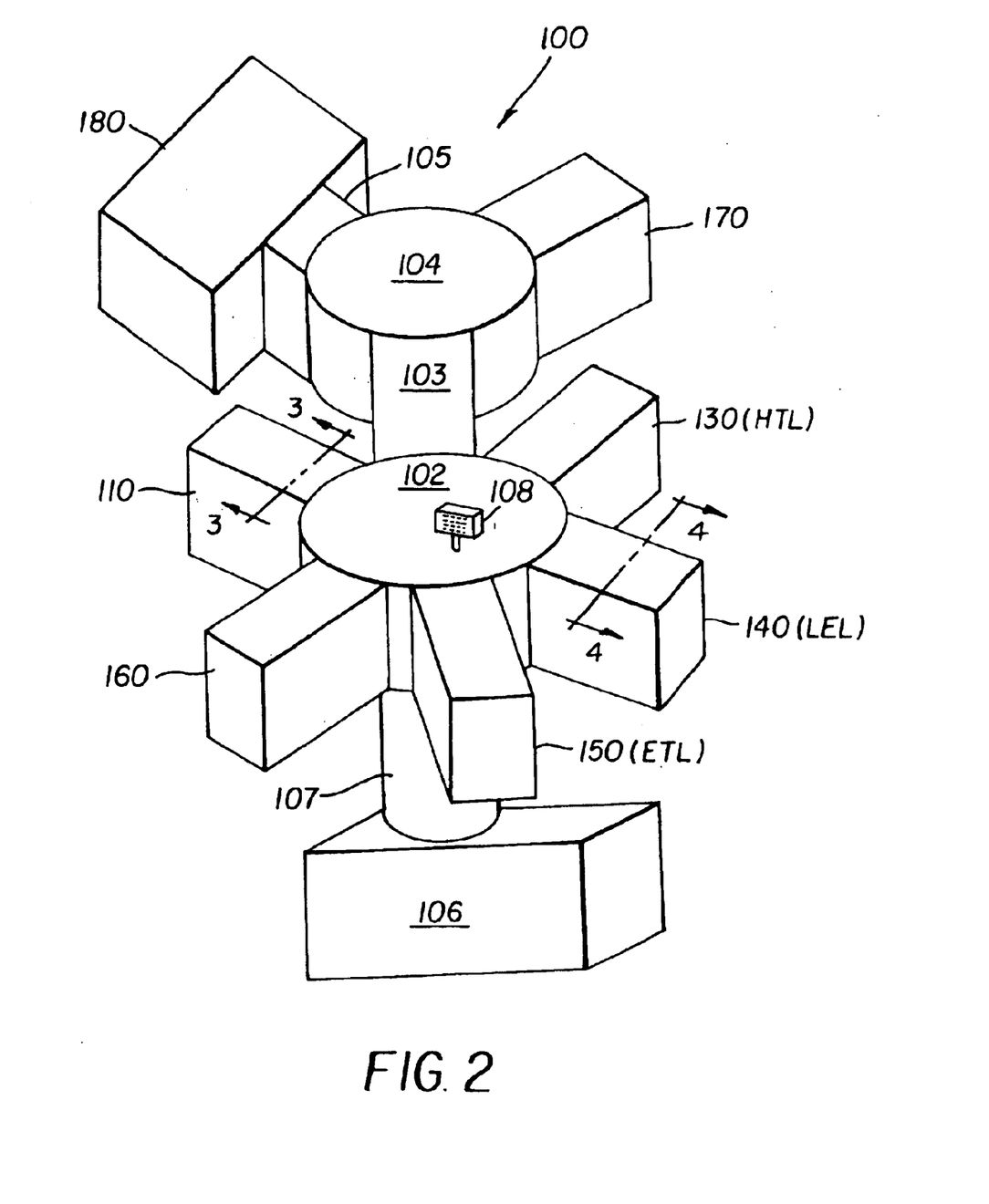
FIG. 2 is a schematic perspective of a manufacturing system suitable for manufacture of a relatively large number of organic light-emitting devices (OLEDs) and having a plurality of stations extending from hubs.

Turning to FIG. 2, a schematic perspective of a manufacturing system 100 is shown which is suitable for manufacture of a relatively large number of organic light-emitting devices using automated or robotic means (not shown) for transporting or transferring substrates or structures among a plurality of stations extending from a buffer hub 102 and from a transfer hub 104. A vacuum pump 106 via a pumping port 107 provides reduced pressure within the hubs 102, 104, and within each of the stations extending from these hubs. A pressure gauge 108 indicates the reduced pressure within the system 100. The pressure can be in a range from about $10^{-3}$ to $10^{-6}$ Torr.

The stations include a load station 110 for providing a load of substrates or structures, a vapor deposition station 130 dedicated to forming organic hole-transporting layers (HTL), a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring structures from the buffer hub 102 to the transfer hub 104 which, in turn, provides a storage station 170, and an encapsulation station 180 connected to the hub 104 via a connector port 105. Each of these stations has an open port extending into the hubs 102 and 104, respectively, and each station has a vacuum-sealed access port (not shown) to provide access to a station for cleaning, replenishing materials, and for replacement or repair of parts. Each station includes a housing which defines a chamber.

Figure 3:
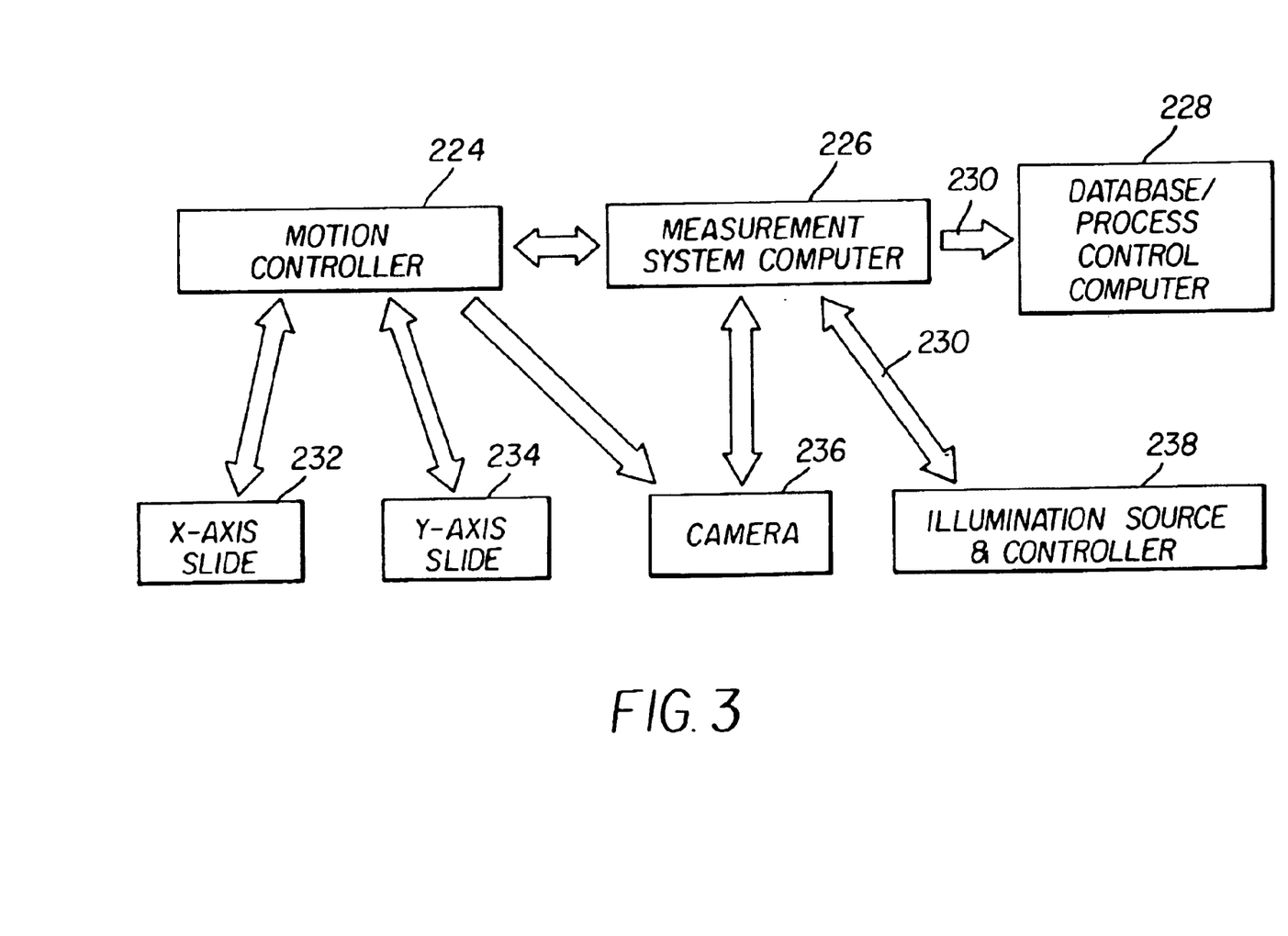
FIG. 3 is a block diagram of a system for practicing the method in accordance with the present invention.

Turning to FIG. 3, a block diagram is shown which depicts the general arrangement of the system components in accordance with the present invention. Motion controller 224 directs the movement of motorized x-axis translation slide 232 and motorized y-axis translation slide 234, and optionally triggers camera 236 and/or illumination source controller 238. Measurement computer 226 initializes motion controller 224, camera 236, and illumination source 238. Measurement computer 226 acquires image from camera 236, and a computer program automatically processes and analyzes the image, then outputs a set of measurements that is received by database/process control computer 228. Arrows show the direction of data flow 230 between the system components. To image the entire area of substrate 11 with sufficient resolution for analysis, it is necessary to acquire multiple images and translate the position of the camera 236 and/or the substrate 11 between each acquisition.

Figure 4A:
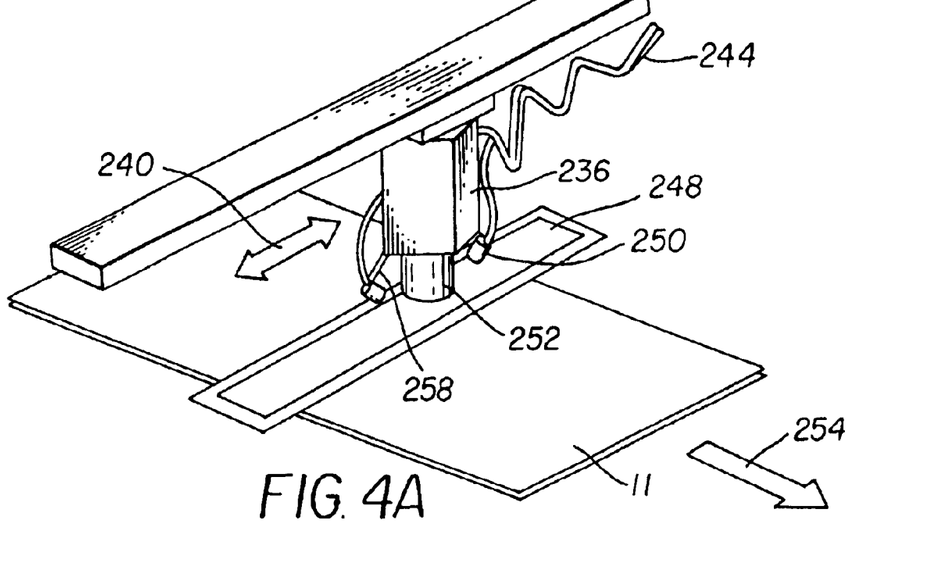
FIG. 4A is a detailed arrangement showing the x, y positioning system for inspection within a vacuum or controlled atmosphere chamber.
Figure 4B:
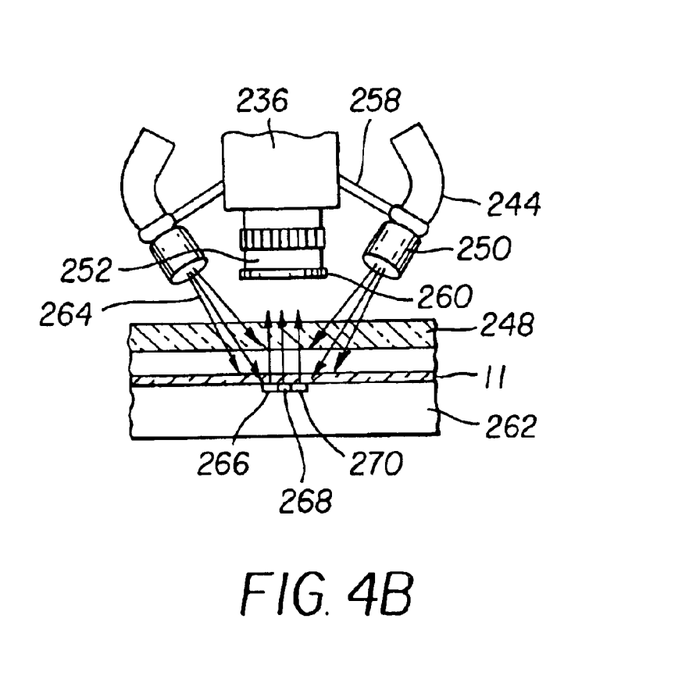
FIG. 4B is an enlarged view of the orientation of the camera, illumination source, and substrate within a vacuum or controlled atmosphere chamber.
Figure 5A:
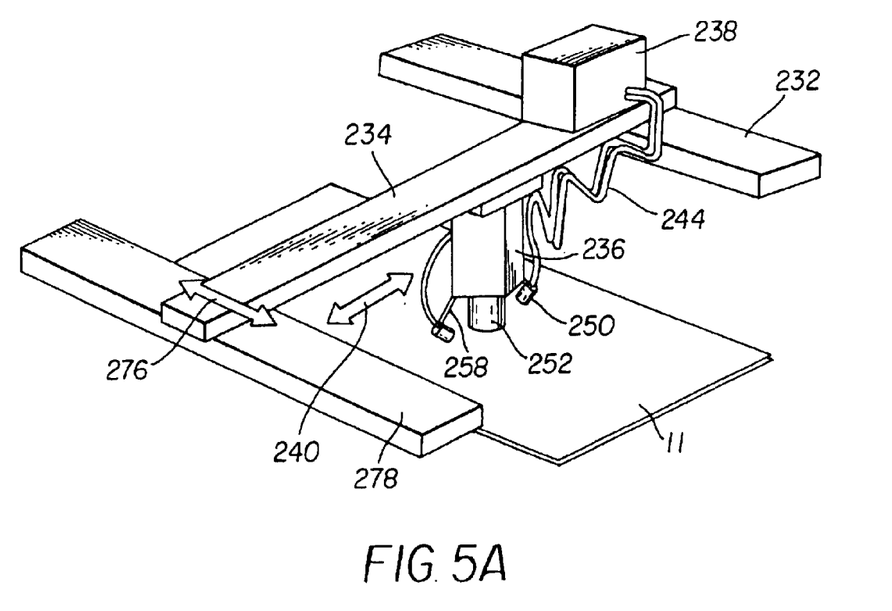
FIG. 5A is a detailed arrangement showing the x, y positioning system for inspection of an encapsulated device.
Figure 5B:
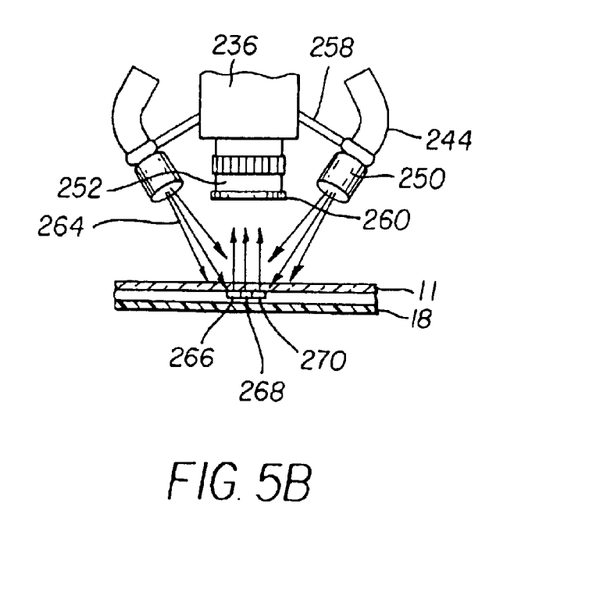
FIG. 5B is an enlarged view of the orientation of the camera, illumination source, and substrate of an encapsulated device.

Two preferred translation arrangements are depicted in FIG. 4 and FIG. 5 and are described below. In both arrangements, the y-axis translation slide 234 translates camera 236 across one substrate axis, here chosen to be the narrow substrate dimension, and its motion can be stepped or continuous. For the remaining axis, here chosen to be the x-axis, the translation action differs between the two arrangements. X-axis translation slide 232 translates (preferably with stepped motion) the camera 236 in the first arrangement and substrate 11 in the second arrangement. In either arrangement, the database/process control computer 228 maintains a historical archive of the measurements, and provides tracking, trending, and alarming functions based on the measurement results.

Turning to FIG. 4A, one of the preferred embodiments of the system is shown. In this embodiment, substrate 11 is located with the vacuum chamber of the OLED manufacturing system 100 or within a controlled atmosphere chamber outside of the vacuum chamber. Inspection of the substrate 11 is accomplished with the camera 236 located outside the vacuum chamber by imaging through inspection window 248. An illumination system includes a plurality of elements which will now be discussed. They are flexible light guides 244, light guide mount 258, illumination optics 250 which are located outside the vacuum chamber. An alternate configuration can locate the camera and/or illumination source within the vacuum chamber. The camera 236 and illumination optics 250 are translated along inspection window 248 using y-axis translation slide 234 and flexible light guides 244. The direction of translation along the y-axis is indicated by arrow 240. As an alternative to light guides 234, a smaller illumination source such as an LED or fluorescent tube ring-light can be translated along with camera 236. After scanning the desired locations along the y-axis, the substrate is translated along the x-axis as shown by arrow 254, and then the y-axis scan is repeated to inspect new areas as desired.

It should be noted that many orientations of the illumination source and camera with respect to the substrate 11 are possible; for example, the substrate 11 can be inverted, or the camera placed on the opposite side of the substrate from the illumination source, or both.

FIG. 4B shows an enlarged view of the inspection system shown in FIG. 4A. Illumination of the substrate 11 within vacuum 262 is achieved by conducting the illumination light 264 through light guide 244, illumination optics 250 and inspection window 248. The light passes through substrate 11 and a portion is absorbed by the organic materials the device pixels 266, 268, 270. Illumination optics 250 can include components such as lenses and filters necessary to improve the quality of the illumination light 264. An alternate orientation would be where the inspection is performed from the same side of the substrate 11 as the organic layers, permitting inspection on non-transmissive substrates. For the purposes of this inspection, the substrate 11 can be formed of any material, including glass, polymer, and silicon.

Excitation with light in the ultraviolet region offers the potential of inducing emissions of all colors in the visible portion of the spectrum. A wavelength of 365 nm is preferred. The excitation light is provided by an illumination source, which can be any of a variety of sources such as fluorescent tube lamps, ring lights, diffuse lighting fixtures, light emitting diodes, and mercury or xenon arc lamps or flashlamps. Upon emission, a portion of the light passes back through substrate 11 and inspection window 248, and is captured by camera 236. The camera lens 252 can provide magnification, allowing inspection of very small features. A filter 260 can be employed on camera lens 252 to limit the range of wavelengths reaching the camera imager.

Another inspection arrangement is shown in FIG. 5A. In this embodiment, a preferably encapsulated OLED substrate can be inspected outside the vacuum chamber, typically at an inspection station. To reduce the space occupied by the system, the camera 236 is translated (rather than the substrate 11) in both x- and y-directions (indicated by translation arrows 240, 276) using translation slides 232, 234, and secondary x-axis translation slide 278 in order to scan the substrate area. Secondary x-axis translation slide 278 is optional, and if present it may not be motorized depending on the weight of the mounted components and the degree of structural stability provided by slides 232 and 234. To accommodate a short light-guide length, the illumination source 238 can be mounted to the outer housing of y-axis slide 234 in a fixed position, and translated along the x-axis by slide 232. FIG. 5B shows an enlarged view of the inspection arrangement. This arrangement is similar to FIG. 4B, but here the substrate 11 is shown as encapsulated by cover 18 and is not depicted within the vacuum chamber. Another embodiment of this invention holds the camera stationary while moving the substrate, which may be advantageous if the larger physical space occupied by the system is acceptable.

In accordance with the present invention, a measurement and analysis process can be incorporated to produce a complete system for inspecting a substrate containing one or more OLED devices. Ideally an image of the entire substrate would be acquired in a single camera image, but this it is generally not possible for larger substrates as the area that can be inspected with sufficient resolution for analysis is limited by the available resolution of camera imagers. Consequently, the inspection system must be capable of imaging a portion of the substrate surface and/or the entire substrate surface by sampling the substrate via individual images from different locations. These images are termed image tiles, and can optionally be assembled to produce a mosaic image of the entire substrate (or portion thereof).

A computer program is employed to automatically analyze the images and perform the desired measurements. Two measurement scenarios are described here, although others are possible. The sequence of the steps has been arranged in a logical order, but all steps do not necessarily have to be performed in the described sequence. The first scenario is a stepped measurement process in which the movement is stopped during image acquisition. The second scenario is a continuous scan process in which the camera and substrate are translated relative to each other during image acquisition. In this second scenario, to achieve good image quality, motion blur in the image must be prevented by shuttering or strobing the camera and/or illumination source. Either scenario can employ a continuous or strobed illumination source.

Figure 6:
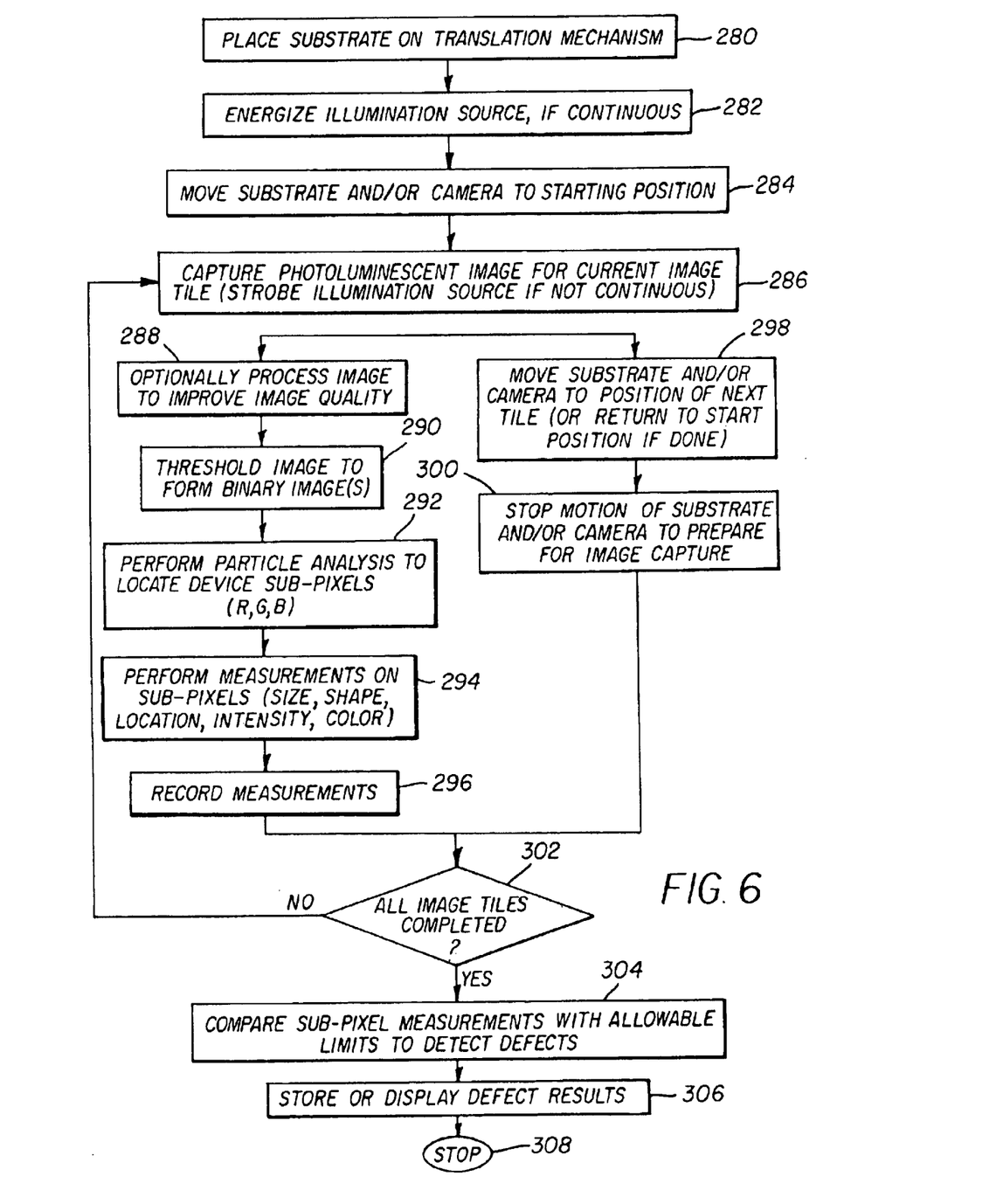
FIG. 6 is a flowchart used by the computer shown in FIG. 3 for determining detected defects in the OLED devices by using step and measure inspection system.

FIG. 6 shows the steps in a stepped measurement process in accordance with the invention. This process generally follows the order of step to next position, stop, measure, and repeat. The substrate 11 is placed on an inspection platform or translation stage (step 280) and the illumination source energized if it is continuous (step 282). The substrate 11 can be optionally mounted in a frame for better support and handling. The substrate 11 or camera 236 is moved to the starting position (step 284) and the first photoluminescent image is acquired by the camera 236 (step 286) and transferred to measurement system computer 226 for subsequent analysis. If the illumination source 238 is not continuous, then the illumination source 238 is strobed during the image acquisition by the camera 236 to minimize motion blur in the acquired image. At this point in the process, there are two branches in the flow of operations, consisting of an analysis branch (steps 288, 290, 292, 294, and 296) and a motion branch (steps 298, 300) which can be run sequentially or in parallel if desired. In the analysis branch, the image can first be processed to improve image quality (step 288). The image is then thresholded to produce a binary image in which all image pixels are either white or black (step 290). The thresholding is performed such that all objects of interest in the image become white, while all background areas become black. For this analysis, the objects of interest constitute the photoluminescent emissions from areas of coated organic materials, in particular emissions from the sub-pixels of the OLED device. Particle analysis techniques (also called blob analysis techniques) are then applied to locate the device sub-pixels (step 292) and measure the parameters of the sub-pixels (step 294). Parameters of interest include but are not limited to size, shape, location, intensity, and color. These measurements are then recorded (step 296) within the measurement system computer 226. In the motion branch of the process, the substrate or camera is moved to the position of the next image tile (step 298) and then stopped (step 300) to await acquisition of the next image tile. After both analysis and motion branches have completed, the progress is evaluated to determine whether the all image tiles have been acquired (step 302). If there are additional image tiles to be acquired, the process is repeated starting with step 286. If all image tiles have been acquired, a comparison is performed to see if the measurements made on this substrate fall within predefined limits for these measurements (step 304). Those measurements falling outside the predefined limits are defined to be defects. Finally, the defect data is stored and optionally displayed (step 306) pending archiving by the database/process control computer 228. The process terminates with step 308.

Figure 7:
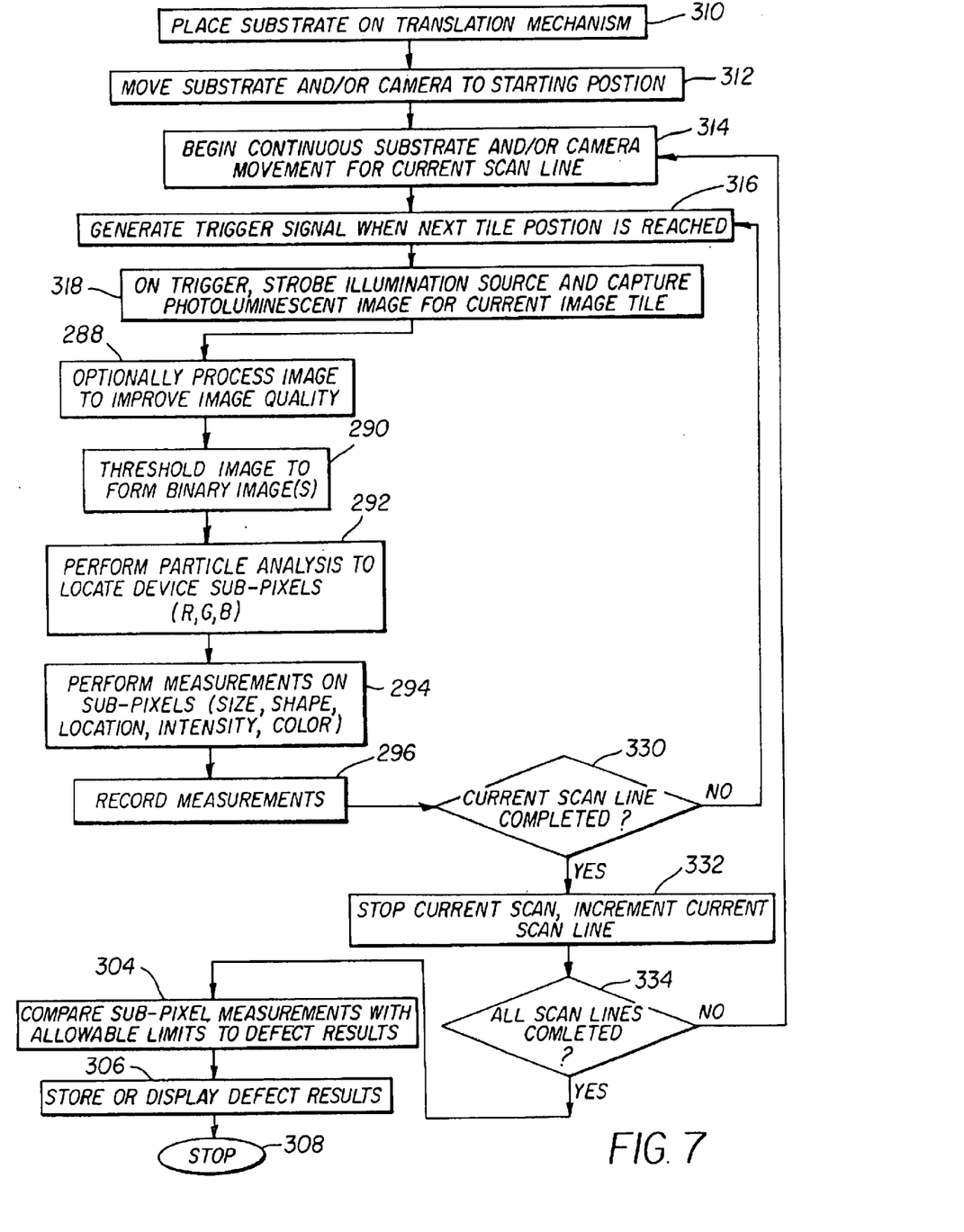
FIG. 7 is a flowchart used by the computer shown in FIG. 3 for determining detected defects in the OLED devices by using a continuous scanning inspection system.

The continuous scan measurement arrangement is described in FIG. 7. Continuous measurement is made possible by strobing the excitation light using a pulsed or shuttered illumination source to minimize motion blur in the acquired image. Alternatively the emission light can be shuttered with either a mechanical or electronic shutter to minimize motion blur in the acquired image. The substrate 11 is first placed on the translation mechanism (step 310). The substrate can be optionally mounted in a frame for better support and handling. The substrate 11 and/or camera 236 is then moved to the starting position (step 312). A continuous scan is then begun along one translation axis (step 314). The position is monitored by motion controller 224, and at the location for the next desired image tile, a trigger signal is generated for the camera 236 and/or illumination source 238 (step 316). Upon receiving this signal, the camera 236 acquires the desired image tile (step 318). Motion blur in the image is prevented by either strobing the illumination source 238 for a sufficiently short time, or by shuttering the camera 236 and/or illumination source 238 for a similarly short time. Upon completed image acquisition, the steps of the previously described analysis branch (steps 288, 290, 292, 294, and 296) are performed. Upon completion of these steps, the motion controller 224 is polled to determine if the current scan line has been completed (step 330). If not complete, the image acquisition and analysis steps are repeated starting at step 316. If the scan line is complete, the current motion is stopped and the scan line counter is incremented (step 332). The value of the scan line counter is then compared to the desired number of scan lines (step 334). If the desired number of scan lines has not yet been achieved, the acquisition and analysis of the next scan line is begun by repeating the process starting at step 314. Once the desired number of scan lines has been reached, the process continues as previously described in steps 304 and 306, and terminates with step 308.

With the inspection system described above, it is also possible to inspect shadow masks for photoluminescent material. This usage can be of interest for detecting residual organic material after performing a mask cleaning process. If a shadow mask was properly cleaned, it can be assumed that there would be little or no detected photoluminescent material. Detected photoluminescent particles can be compared to allowable tolerances similar to the analysis previously described. The residual material would be detectable whether it was on the mask surface or within the holes of the shadow mask. In addition, if the shadow mask was placed on a fluorescent background, the holes themselves can be inspected with or without the presence of residual organic material.

The invention has been described in detail with particular reference to certain preferred embodiments thereof, but it will be understood that variations and modifications can be effected within the spirit and scope of the invention.

Parts List

10 organic light-emitting device (OLED)
11 substrate or structure
12 first electrodes
13 organic hole-transporting layer (HTL)
14 organic light-emitting layer (LEL)
15 organic electron-transporting layer (ETL)
16 second electrodes
18 encapsulation or cover
100 OLED manufacturing system
102 buffer hub
103 unload station
104 transfer hub
105 connector port
106 vacuum pump
107 pumping port
108 pressure gauge
110 load station
130 vapor deposition station (organic HTL)
140 vapor deposition station (organic LEL)
150 vapor deposition station (organic ETL)
160 vapor deposition station (second electrodes)
170 storage station
180 encapsulation station
224 motion controller system
226 measurement system computer
228 database/process control computer
230 data flow arrows
232 x-axis translation slide
234 y-axis translation slide
236 camera
Parts List Cont'd
238 illumination source/controller/power supply
240 y-axis translation arrow
244 flexible light guides
248 inspection window
250 illumination optics
252 camera lens
254 x-axis translation arrow
258 light guide mount
260 optical filter
262 vacuum
264 illumination
266 red fluorescing pixel
268 green fluorescing pixel
270 blue fluorescing pixel
276 x-axis translation arrow
278 secondary x-axis translation slide 280 block
282 block
284 block
286 block
288 block
290 block
292 block
294 block
296 block
298 block
300 block
302 decision block
304 block
306 block
Parts List Cont'd
308 block
310 block
312 block
314 block
316 block
318 block
330 decision block
332 block
334 decision block

What is claimed is:

1. A method of determining defects in OLED devices having a plurality of pixels, each with its own emissive layer, which are capable of being excited by input light to produce an output color light response, comprising the steps of:
   a) illuminating one or more OLED devices or a portion of an OLED device with light in a predetermined portion of the spectrum so that the pixel emissive layers are excited to produce an output color response for each pixel;
   b) capturing an image of the output light produced by the excited pixels and converting such captured light into a digital image; and
   c) determining device pixel size, shape, location, and emitted light intensity from the digital image and comparing such size, shape, location, and emitted light intensity with predetermined acceptable size, shape, location, and emitted light intensity ranges to determine whether there is a defect in the OLED device(s), wherein step c) is accomplished using a computer program which responds to the captured digital image to automatically determine whether there is a defect or producing an output visual image and wherein a user inspects such image to determine its defects.

2. The method of claim 1 where the plurality of pixels includes pixels and/or sub-pixels of different colors in the OLED device.

3. The method of claim 2 where step c) of claim 1 includes the analysis of color.

4. The method of claim 2 wherein the illumination source produces ultraviolet light which is capable of exciting the pixels to produce different colored light.

5. A method of determining defects in OLED devices having a plurality of pixels, each with its own emissive layer, which are capable of being excited by input light to produce an output color light response, comprising the steps of:
   a) providing a source of illumination which produces light in a predetermined portion of the spectrum;
   b) sequentially positioning, in x,y directions the OLED device(s), relative to such source, one or more OLED device(s) with light to illuminate different portions of the OLED device(s) in a predetermined portion of the spectrum so that the pixel emissive layers are excited to produce an output color response for each pixel;
   c) magnifying the portions of the light produced by excited pixels;
   d) capturing an image of the output light produced by the excited pixels and converting such captured light into a digital image; and
   e) determining device pixel size, shape, location, and emitted light intensity from the digital image and comparing such size, shape, location, and emitted light intensity with predetermined acceptable size, shape, location, and emitted light intensity ranges to determine whether there is a defect in the OLED device(s).

6. The method of claim 5 wherein the positioning in step b) follows the order of step to next position, stop, measure, and repeat.

7. The method of claim 5 wherein the positioning in step b) is provided by continuously moving the OLED device(s) and using a pulsed or shuttered illumination source to produce a strobed illumination source.

8. The method of claim 5 wherein the positioning in step b) is provided by continuously moving the OLED device(s) and using an electronic or mechanical shutter on the emitted light prior to detection by the camera.

9. The method of claim 5 wherein step e) is accomplished using a computer program which responds to the captured digital image to automatically determine whether there is a defect or producing an output visual image and wherein a user inspects such image to determine its defects.

10. The method of claim 5 including different colored light from different pixels in the OLED device.

11. The method of claim 5 wherein the illumination source produces ultraviolet light which is capable of exciting the pixels to produce different colored light.

12. The method of claim 5 wherein the OLED device is located with a vacuum or controlled atmosphere chamber in the manufacturing process.

13. The method of claim 5 wherein the OLED device is located on an inspection station outside the vacuum or controlled atmosphere chamber.

14. The method of claim 5 wherein the OLED devices are encapsulated.

* * * * *